(12) United States Patent
Nedalgi

(10) Patent No.: US 7,741,874 B2
(45) Date of Patent: Jun. 22, 2010

(54) ELECTRONIC CIRCUIT

(75) Inventor: Dharmaray M. Nedalgi, Bangalore (IN)

(73) Assignee: NXP B.V., Eindhoven (NL)

( * ) Notice: Subject to any disclaimer, the term of this patent is extended or adjusted under 35 U.S.C. 154(b) by 73 days.

(21) Appl. No.: 12/297,004

(22) PCT Filed: Apr. 11, 2007

(86) PCT No.: PCT/IB2007/051296

§ 371 (c)(1),
(2), (4) Date: Oct. 13, 2008

(87) PCT Pub. No.: WO2007/116378

PCT Pub. Date: Oct. 18, 2007

(65) Prior Publication Data

US 2009/0261860 A1    Oct. 22, 2009

(30) Foreign Application Priority Data

Apr. 12, 2006 (EP) .................................. 06112522

(51) Int. Cl.
*H03K 19/0175* (2006.01)

(52) U.S. Cl. .............................. 326/83; 326/81; 326/68; 327/112; 327/333

(58) Field of Classification Search .................. 326/68, 326/81, 83, 87; 327/333
See application file for complete search history.

(56) References Cited

U.S. PATENT DOCUMENTS

| | | | |
|---|---|---|---|
| 5,194,767 A | | 3/1993 | Chao |
| 5,414,314 A | | 5/1995 | Thurber, Jr. |
| 5,465,054 A | * | 11/1995 | Erhart .......................... 326/34 |
| 5,604,449 A | * | 2/1997 | Erhart et al. ................... 326/81 |
| 5,892,371 A | | 4/1999 | Maley |
| 5,939,932 A | * | 8/1999 | Lee ............................. 327/436 |
| 6,031,395 A | * | 2/2000 | Choi et al. ..................... 326/83 |
| 6,064,227 A | * | 5/2000 | Saito ............................ 326/68 |
| 6,346,829 B1 | * | 2/2002 | Coddington .................. 326/81 |
| 6,377,075 B1 | | 4/2002 | Wong |
| 6,392,440 B2 | * | 5/2002 | Nebel ........................... 326/81 |
| 6,407,579 B1 | * | 6/2002 | Goswick ....................... 326/81 |
| 6,529,082 B1 | * | 3/2003 | Boerstler et al. .............. 331/17 |
| 6,650,156 B1 | * | 11/2003 | Reid et al. .................... 327/157 |
| 7,190,191 B1 | * | 3/2007 | Mathur et al. ................. 326/68 |
| 7,224,195 B2 | * | 5/2007 | Pilling et al. ................. 327/112 |
| 7,639,059 B1 | * | 12/2009 | Yu et al. ...................... 327/333 |

(Continued)

*Primary Examiner*—Vibol Tan

(57) ABSTRACT

An electronic circuit is provided comprising an input ($V_{IN}$) for coupling a circuit of a first voltage domain to the electronic circuit, and a first, second, third and fourth transistor coupled between a supply voltage (VDD) and a voltage (VSS). The third transistor (M1) is coupled between the voltage (VSS) and a first node (tn). The second transistor (M2) is coupled between a second node (tp) and the output ($V_{OUT}$). The third transistor (M3) is coupled between the first node (tn) and the output ($V_{OUT}$). The fourth transistor (M4) is coupled between the supply voltage (VDD) and the second node (tp). A first reference voltage generating unit (RC) receives the voltage at the first node (tn) and the voltage (VSS) as input, and its output is coupled to the gate of the second transistor (M2). A second reference voltage generating unit (RD) receives the supply voltage (VDD) and the voltage of the second node (tp) as input, and its output is coupled to the gate of the third transistor (M3). The first and second reference voltage generating units (RD, RC) generate a reference voltage according to at least one of the logic states of the first, second, third or fourth transistor (M1-M4).

7 Claims, 8 Drawing Sheets

U.S. PATENT DOCUMENTS

2002/0041194 A1 4/2002 Onizawa et al.
2002/0186058 A1 12/2002 Prodanov
2005/0219778 A1* 10/2005 Shigenari .................... 361/56
2007/0052445 A1* 3/2007 Wu et al. .................... 326/81

* cited by examiner

ELECTRONIC CIRCUIT

The present invention relates to an electronic circuit as well as an electronic device.

The gate-source, gate-drain or drain-source voltages for NMOS and PMOS transistors in conventional CMOS circuits are typically equal to the supply voltage. However, in advanced processes like the 65 nm technology, input/output IO devices are able to receive up to 2.75 V, i.e. 2.5 V nominal, across the gate-source, the gate-drain or the drain-source, while still being reliable and avoiding hot carrier degradation or oxide breakdown. On the other hand, many signaling standards like USB operate at 3.3 V. Therefore, the circuit techniques are required which are able to cope with 3.3V signaling while still using 2.5V devices.

FIG. 1 shows a circuit diagram of a conventional CMOS inverter. The inverter comprises a PMOS transistor M1 and a NMOS transistor M2 which are coupled between the supply voltage VDD and VSS. The steady state output $V_{OUT}$ and the steady state input $V_{IN}$ voltages will correspond to a logic high or logic low state. In both of these cases, the gate-source, the gate-drain or drain-source voltages of the transistors M1, M2 are equal to VDD or 0 V according to the actual logic state of the inverter. However, as mentioned above, if the inverter is operated at 3.3 V while being fabricated using 2.5 V devices, both of the transistors M1, M2 will experience a stress which may influence the long term reliability due to hot carrier degradation or gate-oxide breakdown.

FIG. 2 shows a circuit diagram of an inverter according to the prior art. In particular, FIG. 2 relates to U.S. Pat. No. 6,377,075. The circuit comprises two PMOS transistors M2, M4 and two NMOS transistors M1, M3. The four transistors M1-M4 are coupled in series between the supply voltage VDD and VSS. By cascoding the transistors M1-M4, the high voltage stress as experienced by the particular devices may be reduced. The gates of the transistors are coupled to a fixed intermediate voltage ngate and pgate. The circuit according to FIG. 2 requires the provision of additional supply voltages pgate and ngate or alternatively the provision of a reference generator. However, the provision of an additional supply voltage or the provision of a reference generator will introduce an increased static current consumption.

It is therefore an object of the invention to provide an electronic circuit based on CMOS circuits, which can improve the ability of the circuit to withstand stress on the circuits due to an increased input voltage.

This object is solved by an electronic circuit according to claim 1 and an electronic device according to claim 7.

Therefore, an electronic circuit is provided comprising an input for coupling a circuit of a first voltage domain to the electronic circuit, and a first, second, third and fourth transistor coupled between a supply voltage and a voltage. The third transistor is coupled between the voltage and a first node. The second transistor is coupled between a second node and the output. The third transistor is coupled between the first node and the output. The fourth transistor is coupled between the supply voltage and the second node. A first reference voltage generating unit receives the voltage at the first node and the voltage as input, and its output is coupled to the gate of the second transistor. A second reference voltage generating unit receives the supply voltage and the voltage of the second node as input, and its output is coupled to the gate of the third transistor. The first and second reference voltage generating units generate a reference voltage according to at least one of the logic states of the first, second, third or fourth transistor.

As the reference voltages are generated according to the logic states of some of the transistors the generation is performed dynamically and any static currents due to static or constant reference voltage generators are avoided.

According to an aspect of the invention, the first reference voltage generating unit is implemented as a ninth transistor coupled between the first node and the gate of the second transistor and the second reference voltage generating unit is implemented as a seventh transistor coupled between the second node and the gate of the third transistor. The gate of the seventh transistor is coupled to the supply voltage, and the gate of the ninth transistor is coupled to the voltage. The implementation of the reference voltage generating units as transistors is advantageous regarding the costs, the required chip area and the static current requirements.

According to a further aspect of the invention, the first and third transistors are of a first conductivity type, while the second and fourth transistors are of a second conductivity type.

According to an aspect of the invention, the circuit comprises a fifth transistor coupled between input and the gate of the first transistor and a sixth transistor coupled between the input and the gate of the fourth transistor. A third reference voltage generating unit receiving the supply voltage and the voltage at a third node as input, and its output is coupled to the gate of the fifth transistor. A fourth reference voltage generating unit receives the voltage and the voltage at a fourth node as input signals, and its output is coupled to the gate of the sixth transistor. The third and fourth reference voltage generating units generate a reference voltage according to the logic states at the gate of the fourth transistor and the gate of first transistor, respectively.

According to an aspect of the invention, the third reference voltage generating unit is implemented as an eighth transistor coupled between the gate of the fourth and fifth transistor and the fourth reference voltage generating unit is implemented as a tenth transistor coupled between a fourth node and the gate of the sixth transistor. The gate of the eighth transistor is coupled to the supply voltage, wherein the gate of the tenth transistor is coupled to the voltage.

According to a further aspect of the invention an eleventh transistor coupled between the fourth node and the gate of the third transistor, a twelfth transistor coupled between the gates of the first and second transistor, a thirteenth transistor coupled between the first node and the gate of the sixth transistor, and a fourteenth transistor coupled between the second node and the gate of the fifth transistor. The gates of the eleventh and the fourteenth transistor are coupled to the supply voltage. The gates of the twelfth and thirteenth transistor are coupled together and are coupled to the voltage Vss. The eleventh, twelfth, thirteenth and fourteenth transistor are provided to avoid sub-threshold currents in the seventh, eighth, ninth and tenth transistors by providing high resistors in form of the turned off transistors.

The invention also relates to an electronic device comprising an input for coupling a circuit of a first voltage domain to the electronic circuit, and a first, second, third and fourth transistor coupled between a supply voltage and a voltage. The third transistor is coupled between the voltage and a first node. The second transistor is coupled between a second node and the output. The third transistor is coupled between the first node and the output. The fourth transistor is coupled between the supply voltage and the second node. A first reference voltage generating unit receives the voltage at the first node and the voltage as input, and its output is coupled to the gate of the second transistor. A second reference voltage generating unit receives the supply voltage and the voltage of the second node as input, and its output is coupled to the gate of the third transistor. The first and second reference voltage generating units generate a reference voltage according to at least one of the logic states of the first, second, third or fourth transistor.

The invention relates to the idea to avoid constant reference voltages and to rather introduce dynamically generated reference voltages depending on the actual logic state of the circuit. Accordingly, additional supply rails or bias generating circuits which may consume additional static current can be avoided.

The embodiments and advantages of the invention will now be described in detail with reference to the drawings.

FIG. 1 shows a circuit diagram of a CMOS inverter according to the prior art,

FIG. 2 shows a circuit diagram of a further inverter based on CMOS circuits according to the prior art, FIG. 3 shows a circuit diagram of an inverter according to a first embodiment, FIG. 4 shows a circuit diagram of an inverter according to a second embodiment, FIG. 5 shows a circuit diagram of an inverter according to a third embodiment, FIG. 6 shows a graph of a transfer function of an inverter, FIG. 7 shows a graph of a transfer function of an inverter, FIG. 8 shows a graph of input, output and intermediate signals of an inverter, FIG. 9 shows a further graph of a transient function of the input, the output and intermediate signals, and FIG. 10 shows a circuit diagram of a level shifter circuit according to a fourth embodiment.

FIG. 3 shows a circuit diagram of an inverter according to a first embodiment. The inverter comprises a cascoded structure of four transistors, namely the NMOS transistors M1, M3 and the PMOS transistors M2, M4. These four transistors M1-M4 are coupled between the supply voltage VDD and VSS. The gate of the first transistor M1 is coupled to a node tgn and the gate of the fourth transistor M4 is coupled to a node tgp. The first transistor M1 is coupled between the node tn and VSS. The third transistor M3 is coupled between the output $V_{OUT}$ and the node tn. The gate of the third transistor M3 is coupled to node D. The second transistor M2 is coupled between the output $V_{OUT}$ and the node tp. The gate of the second transistor M2 is coupled to node C. The fourth transistor M4 is coupled between the node tp and the supply voltage VDD. The fifth transistor M5 is coupled between the node tgn and the input $V_{IN}$ and its gate is coupled to node A. A sixth transistor M6 is coupled between tgp and the input $V_{IN}$. Its gate is coupled to node B.

The inverter furthermore comprises four reference voltage generating units RA-RD. The first reference voltage generating unit RA receives the supply voltage VDD and the node tgp as inputs and its outputs corresponds to node A, i.e. its output is coupled to the gate of the fifth transistor M5. The second reference voltage generating unit RB receives VSS and the voltage at the node tgn as inputs and output is used at node B, i.e. its output is coupled to the gate of the sixth transistor M6. The third reference voltage generating unit RC receives the voltage VSS and the voltage at the node tn and its output is coupled to the gate of the second transistor M2, i.e. node C. The fourth reference voltage generating unit RN receives the supply voltage VDD and the voltage at the node tp as inputs and its output is coupled to the gate of the third transistor M3, i.e. to node D. In other words, the gate voltage of the third transistor M3 is derived from the voltage at node tp and the supply voltage VDD. The gate voltage of the second transistor M2 is derived from the voltage at node tn and VSS. Accordingly, the reference voltages can be generated dynamically without any static current. Therefore, no additional static reference voltage generating units are required such that the required static power can be reduce.

FIG. 4 shows a circuit diagram of an inverter according to the second embodiment. The circuit diagram according to the second embodiment substantially corresponds to the circuit diagram according to the first embodiment. The only difference is that the reference voltage generating units RA-RD are implemented as transistors M7-M10, wherein the seventh and eighth transistor M7 and M8 are NMOS transistors, while the ninth and tenth transistor M9 and M10 are PMOS transistors.

It should be noted that for simplicity reasons the substrate connections of the devices are not explicitly depicted. All of the PMOS substrates are connected to VDD and all of the NMOS substrates are connected to VSS. The gate of the seventh transistor M7 is coupled to VDD, its source is coupled to the node tp and its drain is coupled to the gate of the third transistor M3. The gate of the eighth transistor M8 is coupled to the supply voltage VDD, its source is coupled to the node tgp and its drain is coupled to the gate of the fifth transistor M5. The gate of the ninth transistor M9 is coupled to VSS and its drain is coupled to the node tn while its source is coupled to the gate of the second transistor M2. The gate of the tenth transistor M10 is connected to VSS and its source is connected to tgn while its drain is connected to the gate of the sixth transistor M6.

When the input signal $V_{IN}$ is high, i.e. VDD, the input signal is passed to the node tgp via the transistor M6 and the fourth transistor M4 is turned off. As the gate of the eighth transistor M8 is connected to VDD, the node A will rise to a voltage corresponding to VDD minus $V_t$ such that the fifth transistor M5 is turned on. The node tgn will rise to a voltage corresponding to $((VDD-V_t)-V_t=VDD-2V_t)$. Accordingly, the first transistor M1 is turned on and the node B rises to the voltage at the node tgn. VDD-2$V_t$ via the tenth transistor M10.

The first transistor M1 keeps the node tn to the voltage VSS. Accordingly, the third transistor M3 will be turned on and hold the output voltage $V_{OUT}$ to VSS such that a low output stage is present. The node C will discharge through the ninth transistor M9 to $V_t$ above the VSS. The ninth transistor will turn off as soon as the voltage at the node C has reached the value of $V_t$ above VSS. Accordingly, the node tp will discharge to $V_t$ above the node C (2 $V_t$). As soon as the node tp has discharged to 2 $V_t$, the second transistor M2 will turn off and will keep the node tp at a voltage of 2 $V_t$. The seventh transistor M7 turns on and will connect the node D to the node tp.

In the following it will be shown that the circuit according to FIG. 4 ensures that any stress over the transistors will be within the tolerance limits. For the case of a 3V3 signaling, the highest supply voltage is may be considered as 3.6 volt including a 10% tolerance. The threshold voltages $V_t$ of NMOS and PMOS devices typically equal to 0.45 volt and −0.45 volt. Based on these voltages, the voltages at the different nodes are shown in the following Table 1:

TABLE 1

| Node | | Voltage |
|---|---|---|
| VDD | Supply | 3.6 V |
| VSS | Ground | 0.0 V |
| $V_{IN}$ | Input = VDD | 3.6 V |
| tgp | tgp = $V_{IN}$ | 3.6 V |
| A | tgp − $V_t$ = 3.6 − 0.45 | 3.15 V |
| tgn | A − $V_t$ = 3.15 − 0.45 | 2.7 V |
| B | B = tgn | 2.7 V |
| tn | tn = VSS | 0.0 V |

TABLE 1-continued

| Node | | Voltage |
|---|---|---|
| $V_{OUT}$ | $V_{OUT}$ = VSS | 0.0 V |
| C | tn + $V_t$ = 0 + 0.45 | 0.45 V |
| tp | C + $V_t$ = 0.45 + 0.45 | 0.9 V |
| D | D = tp | 0.9 V |

Accordingly, the maximum voltages for a worst case scenario across the terminals of all of the transistors are shown below in Table 2:

TABLE 2

| Transistor | Terminals | Voltage |
|---|---|---|
| M1 | Gate-source, gate-drain (tgn – VSS) | 2.7 V |
| M2 | Drain-source (tp – $V_{OUT}$) | 0.9 V |
| M3 | Gate-source, gate drain (D – tn) | 0.9 V |
| M4 | Gate-drain, source-drain (tgp – tp, VDD – tp) | 2.7 V |
| M5 | Drain-source ($V_{IN}$ – tgn) | 0.9 V |
| M6 | Gate-source, gate-drain ($V_{IN}$ – B) | 0.9 V |
| M7 | Gate-source, gate-drain (VDD – D) | 2.7 V |
| M8 | Gate-source, gate-drain (VDD – A) | 0.45 V |
| M9 | Gate-source, gate-drain (C – VSS) | 0.45 V |
| M10 | Gate-source, gate-drain (B – VSS) | 2.7 V |

It should be noted that all of these voltages lie within tolerance limit of 2.75 V of the transistors. All of the threshold voltages, which are used to reduce the applied voltages, are back biased (body effect). Accordingly, the threshold voltage $V_t$ increased and will reduce the applied voltage. In addition it should be noted that no static current is present in this stable logic state. It should be noted that the above numbers in Table 1 and Table 2 have merely been chosen to describe the basic principles of the invention. The actual values should not be considered as restricting the principles of the invention.

If the input voltage $V_{IN}$ switches to low (0 V), the state is passed to the node tgn via the fifth transistor M5. Accordingly, the first transistor M1 is turned off. As the gates of the tenth transistor M10 is connected to VSS, the voltages at the node B will discharge to threshold voltage $V_t$ above VSS such that the sixth transistor M6 is turned on. The voltage at the node tgp will discharge to the threshold voltage $V_t$ above the voltage at the node B, turning on the fourth transistor M4. The voltage at node A will discharge to the voltage at the node tgp via the eighth transistor M8. The fourth transistor M4 will pull the voltage of the node tp to the supply voltage. This will turn on the second transistor M2 and will pull the output voltage-$V_{OUT}$ to the supply voltage VDD such that a high output state is passed. The voltage at node D will accordingly be pulled to a voltage corresponding to VDD minus the threshold voltage $V_t$ via the seventh transistor M7. This in turn will turn on the third transistor M3 and will pull the voltage at node tn to (VDD–$V_t$)–$V_t$=VDD–2 $V_t$. As soon as the voltage at the node tn reaches the voltage corresponding to the supply voltage VDD minus the threshold voltage $V_T$, the third transistor M3 will turn off. The voltage at the node C will be connected to the node tn via the ninth transistor M9.

Accordingly, if the input is low, the voltages at the different nodes are shown in the following Table 3:

TABLE 3

| Node | | Voltage |
|---|---|---|
| Vdd | Supply | 3.6 V |
| VSS | Ground | 0.0 V |

TABLE 3-continued

| Node | | Voltage |
|---|---|---|
| $V_{IN}$ | Input = 0 | 0.0 V |
| tgn | tgn = $V_{IN}$ | 0.0 V |
| B | tgn + $V_t$ = 0.0 + 0.45 | 0.45 V |
| Tgp | B + $V_t$ = 0.45 + 0.45 | 0.9 V |
| A | A = tgp | 0.9 V |
| tp | tp = Vdd | 3.6 V |
| $V_{OUT}$ | $V_{OUT}$ = Vdd | 3.6 V |
| D | tp – $V_t$ = 3.6 – 0.45 | 3.15 V |
| tn | D – Vt = 3.15 – 0.45 | 2.7 V |
| C | C = tn | 2.7 V |

Therefore, the maximum voltages in a worst case scenario across the terminals of all of the transistors or devices are shown in the following Table 4:

TABLE 4

| Transistor | Terminals | Voltage |
|---|---|---|
| M1 | Gate-drain, drain-source (tn – VSS) | 2.7 V |
| M2 | Gate-source (tp – C) | 0.9 V |
| M3 | Drain-source ($V_{OUT}$ – tn) | 0.9 V |
| M4 | Gate-source, (vdd – tgp) | 2.7 V |
| M5 | Gate-source (A – $V_{IN}$) | 0.9 V |
| M6 | Drain-source (tgp – $V_{IN}$) | 0.9 V |
| M7 | Gate-source, gate-drain (VDD – D) | 0.45 V |
| M8 | Gate-source, gate-drain (VDD – A) | 2.7 V |
| M9 | Gate-source, gate-drain (C – VSS) | 2.7 V |
| M10 | Gate-source, gate-drain (B – VSS) | 0.45 V |

It should be noted that all voltages are within the tolerance limit of 2.75 V of the transistors or devices. All of the threshold voltages which are used to reduce the applied voltages are back biased (body effect). Accordingly, the threshold voltage $V_T$ increased and will reduce the applied voltage. It should furthermore be noted that no static current is present in this stable state. It should be noted that the above numbers in Table 3 and Table 4 have merely been chosen to describe the basic principles of the invention. The actual values should not be considered as restricting the principles of the invention.

FIG. 5 shows a circuit diagram of an inverter according to a third embodiment. The circuit diagram according to the third embodiment substantially corresponds to the circuit diagram according to the second embodiment. The difference between the circuit diagram according to the third embodiment to the circuit diagram according to the second embodiment is the provision of additional transistors M11-M14 to avoid a possible charge build up on floating gates. The eleventh and fourteenth transistor M11 and M14 are PMOS transistors and the twelfth and thirteenth transistors M12, M13 are NMOS transistors.

Therefore, the circuit diagram according to the third embodiment constitutes an improvement as compared to the circuit diagram according to the second embodiment. According to the second embodiment, when the output voltage $V_{OUT}$ is high, the seventh transistor M7 is turned off once the voltage at the node D reaches the supply voltage VDD minus the threshold voltage $V_t$. However, any sub-threshold current in the seventh transistor M7 will raise the voltage at the node D above the voltage corresponding to the supply voltage VDD minus the threshold voltage $V_t$. The raising of the voltage at the node D can be avoided by coupling an eleventh transistor M11 in the off state between the node D and node tgp such that a high resistance is provided. When the voltage at the node D is high, corresponding to the supply voltage minus the threshold voltage $V_t$, the voltage at node tgp is low and provides a sufficient drain source voltage for the eleventh transistor M11. The eleventh transistor M11 is always off and can thus act as a high resistor with respect to the voltage at the node D. Furthermore, any leakage current in the seventh transistor M7 will be compensated by the leakage in the eleventh transistor M11. The twelfth transistor M12 (NMOS) is provided to avoid any sub-threshold currents on the transistor M9. The thirteenth transistor M13 (NMOS) is provided to avoid any sub-threshold currents on the transistor M10. The fourteenth transistor M14 (PMOS) is provided to avoid any sub-threshold currents on the transistor M8. Accordingly, the twelfth transistor M12 is connected to the node C, the thirteenth transistor M13 is connected to the node B and the fourteenth transistor M14 is connected to the node A such that they each act as high resistors.

The gate of the eleventh transistor M11 is coupled to the supply voltage VDD, its source is connected to the node tgp and its drain is connected to the gate of the third transistor M3. The gate of the twelfth transistor M12 is coupled to VSS, its source is coupled to the node tgn and its drain is coupled to the node C, i.e. the gate of the second transistor M2. The gate of the thirteenth transistor M13 is coupled to VSS while its drains is coupled to the node tn and its source is coupled to the node B, i.e. the gate of the sixth transistor M6. The gate of the fourteenth transistor M14 is coupled to the supply voltage VDD, its source is coupled to the node tp and its drain is coupled to node A, i.e. the gate of the fifth transistor M5.

Figure 1:
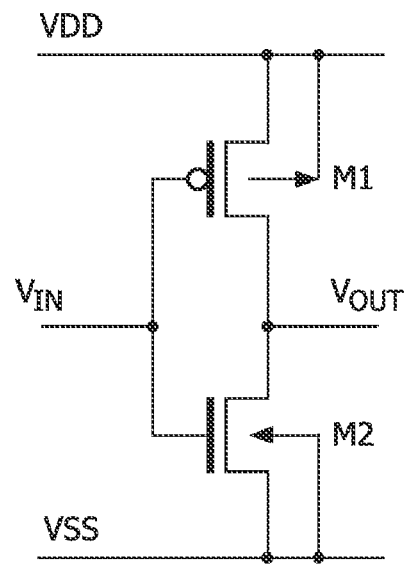
Figure 2:
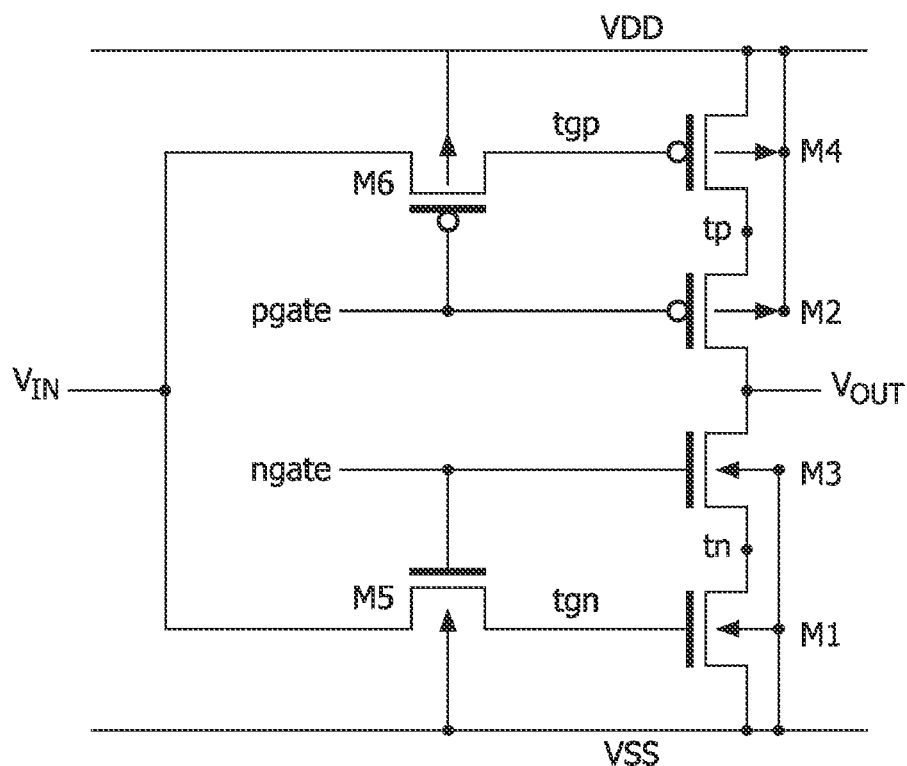
Figure 3:
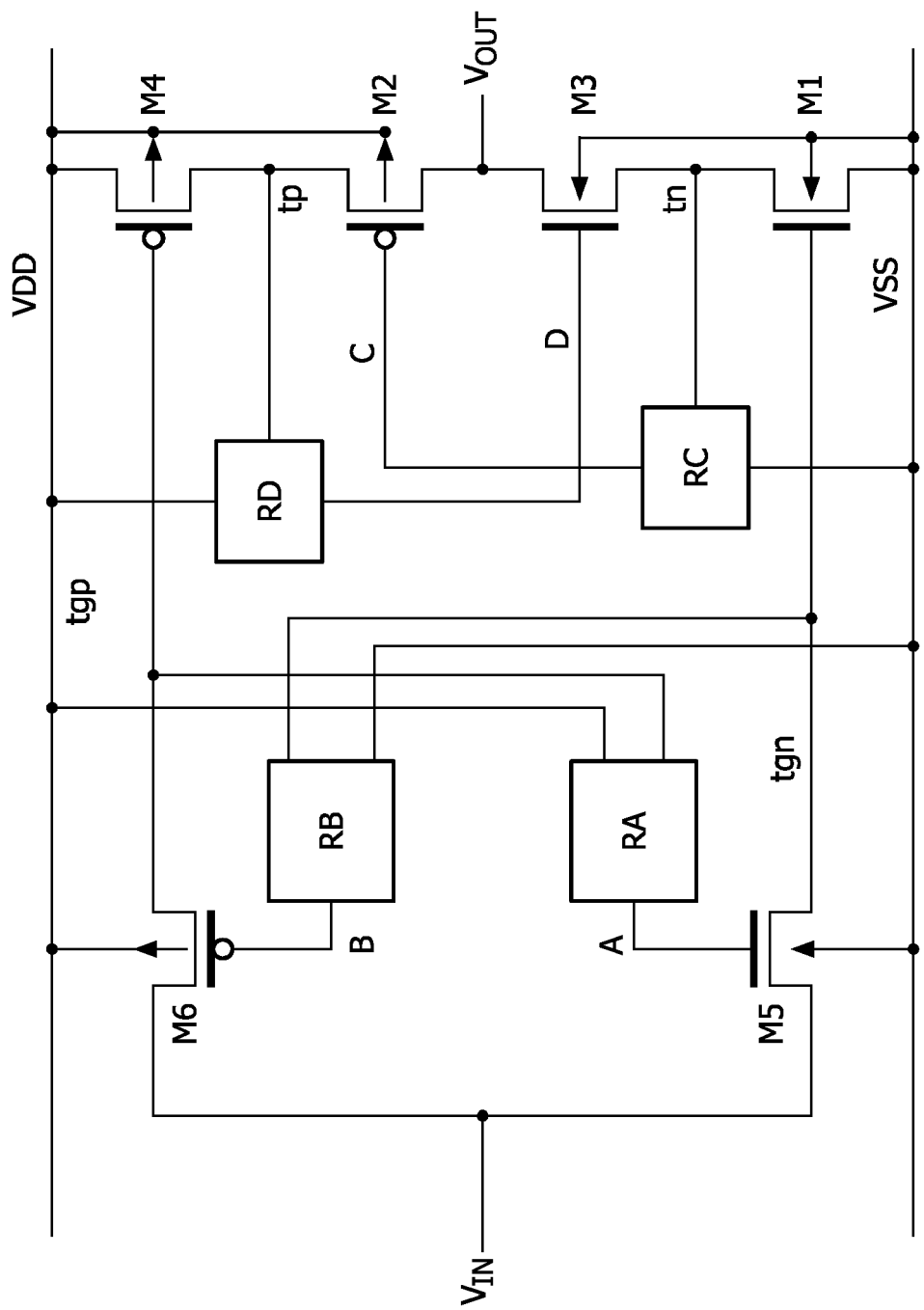
Figure 4:
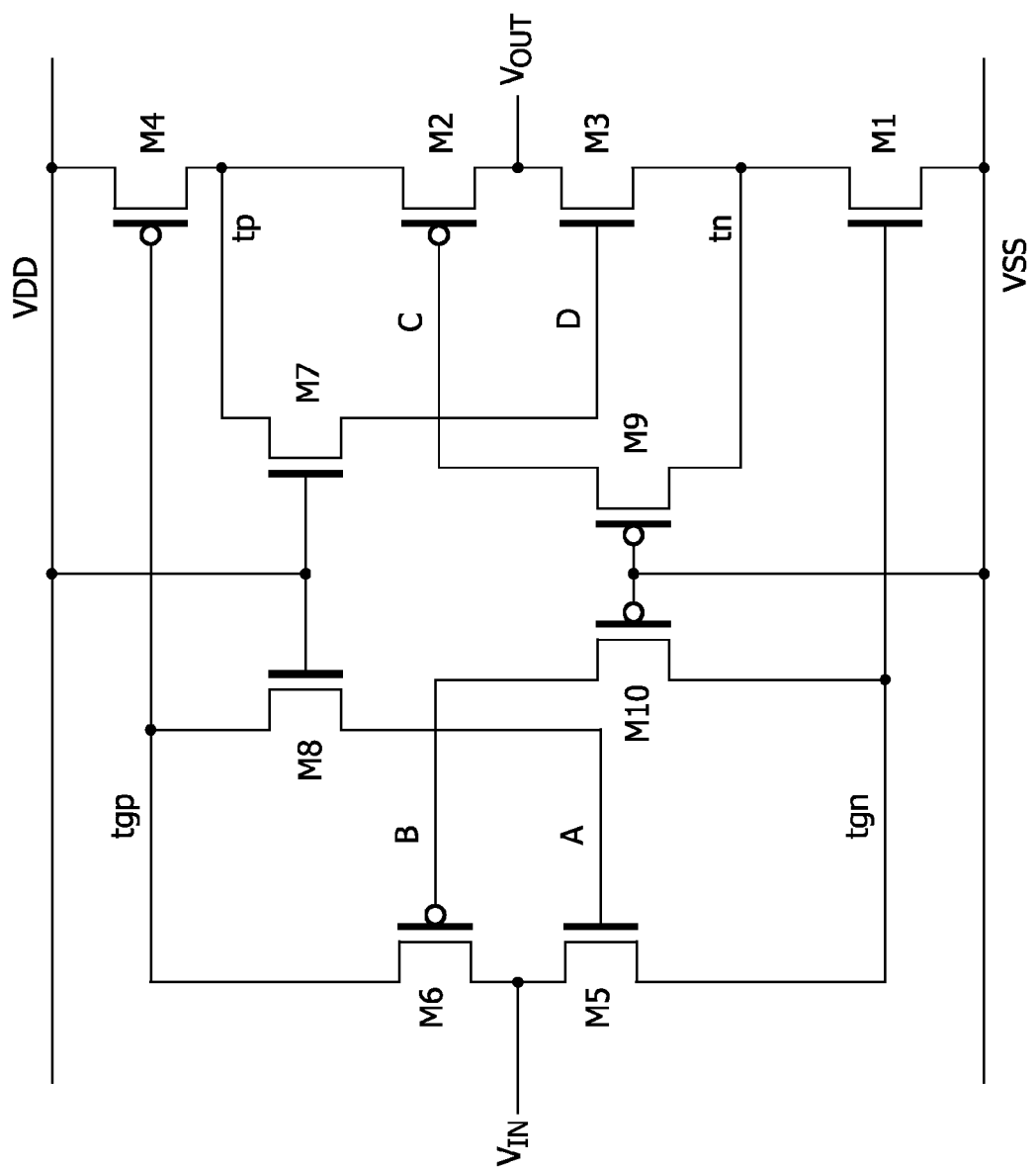
Figure 5:
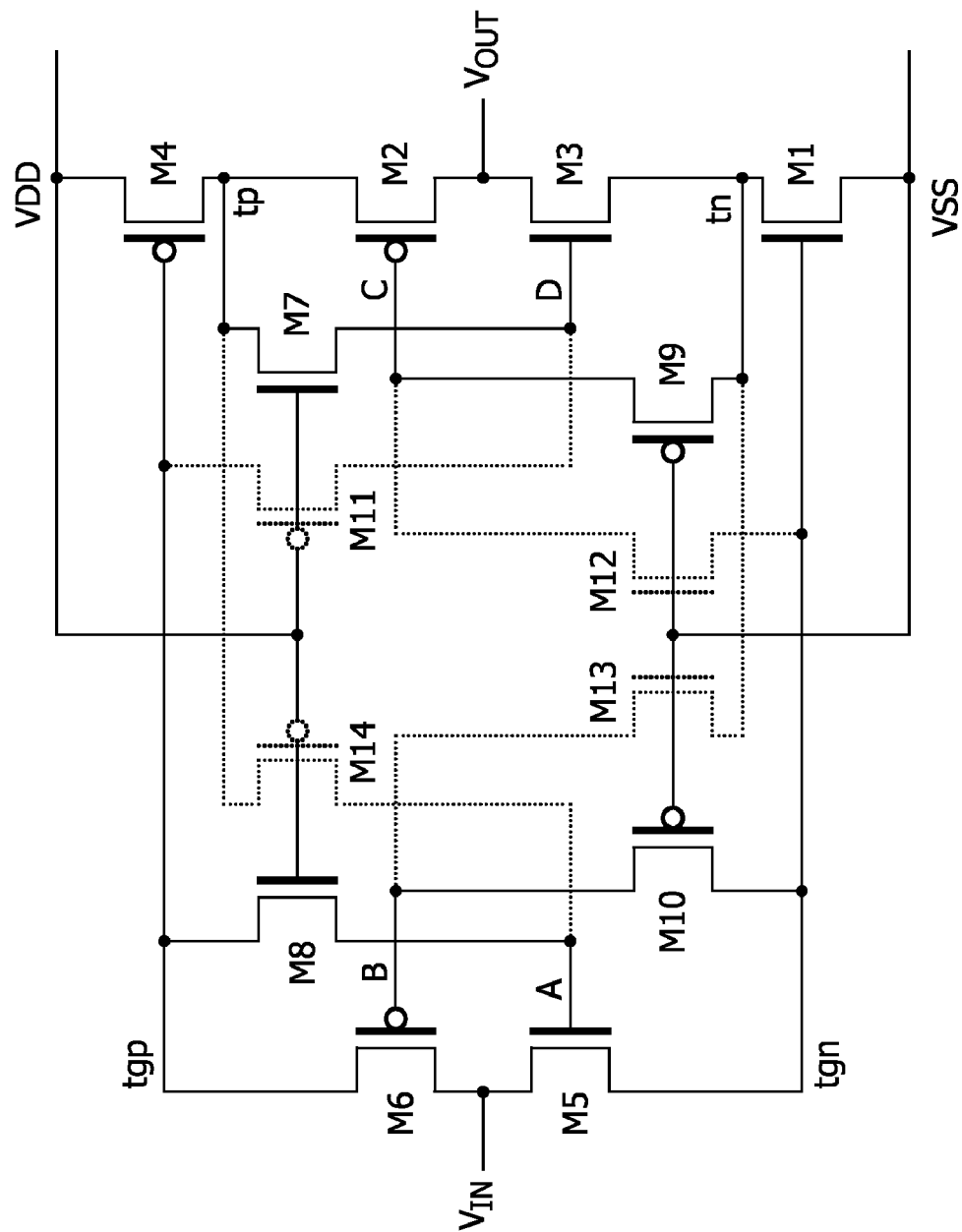
Figure 6:
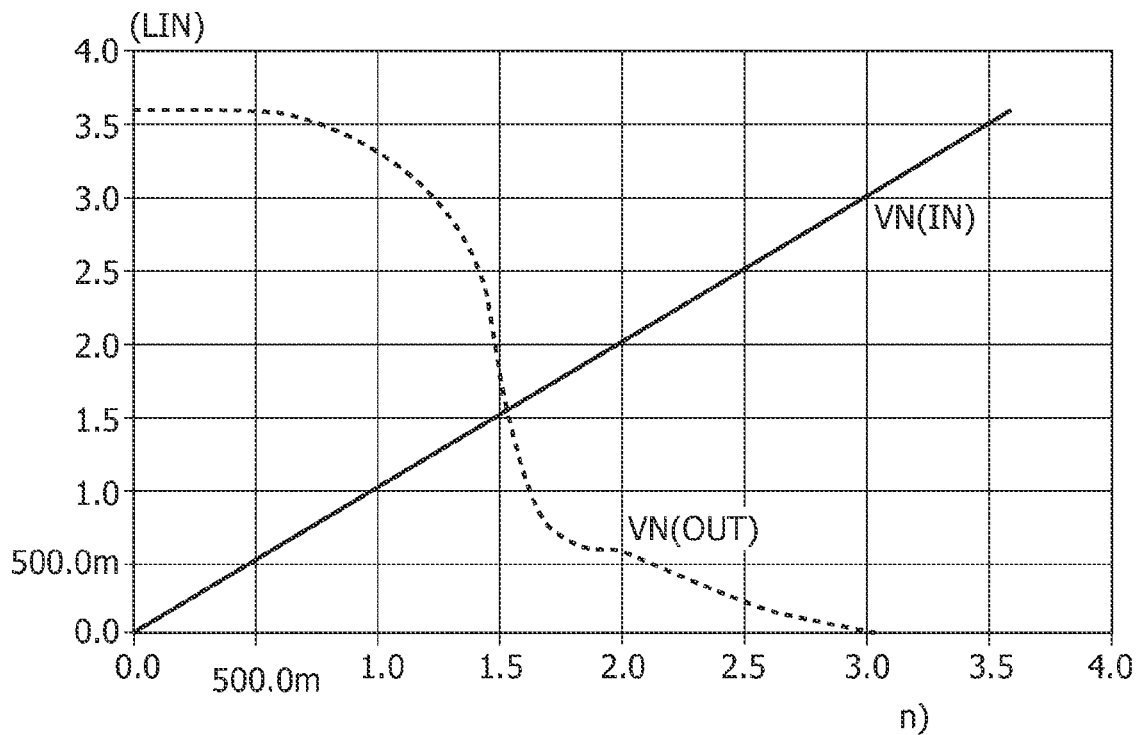
FIG. 6 shows a graph of a transfer function of an inverter. In particular the input voltage $V_{IN}$ is depicted as solid line while the output voltage $V_{OUT}$ is depicted as dotted line.
Figure 7:
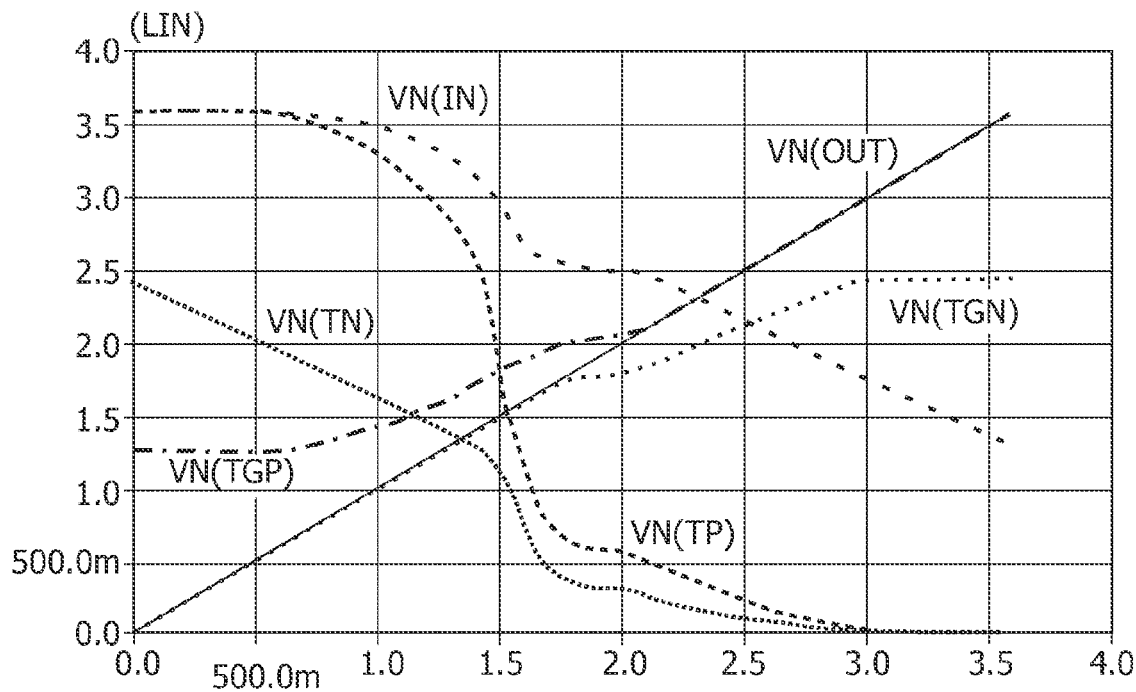
FIG. 7 shows a graph of a transfer function of an inverter as well as intermediate signals. Accordingly, the input signal VN (in), the output signal VN (out), the signal VN (tgn) at the gate tgn, the signal VN (tgp) at the node tgp, the signal VN (tn) at node tn and the signal VN (tp) at node tp are depicted.
Figure 8:
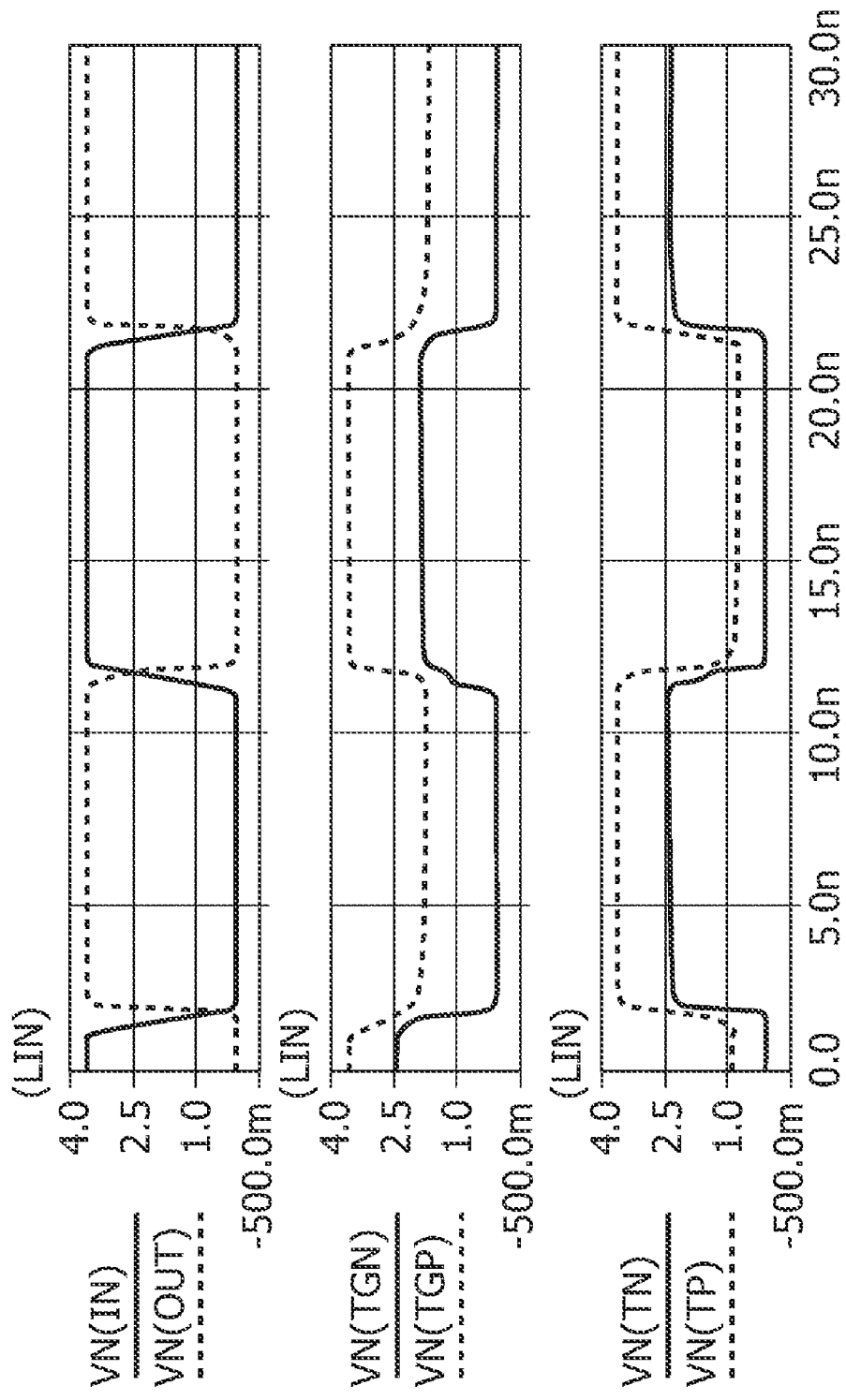

FIG. 8 shows a graph of a transient result of the input signal, the output signal and intermediate signals. In the topmost graph, the input and output signals $V_{IN}$, $V_{OUT}$ of the inverter are shown. In the middle graph, the signals at the node tgn and tgp are shown. In the bottommost graph, the signals of the nodes tn and tp are shown.

Figure 9:
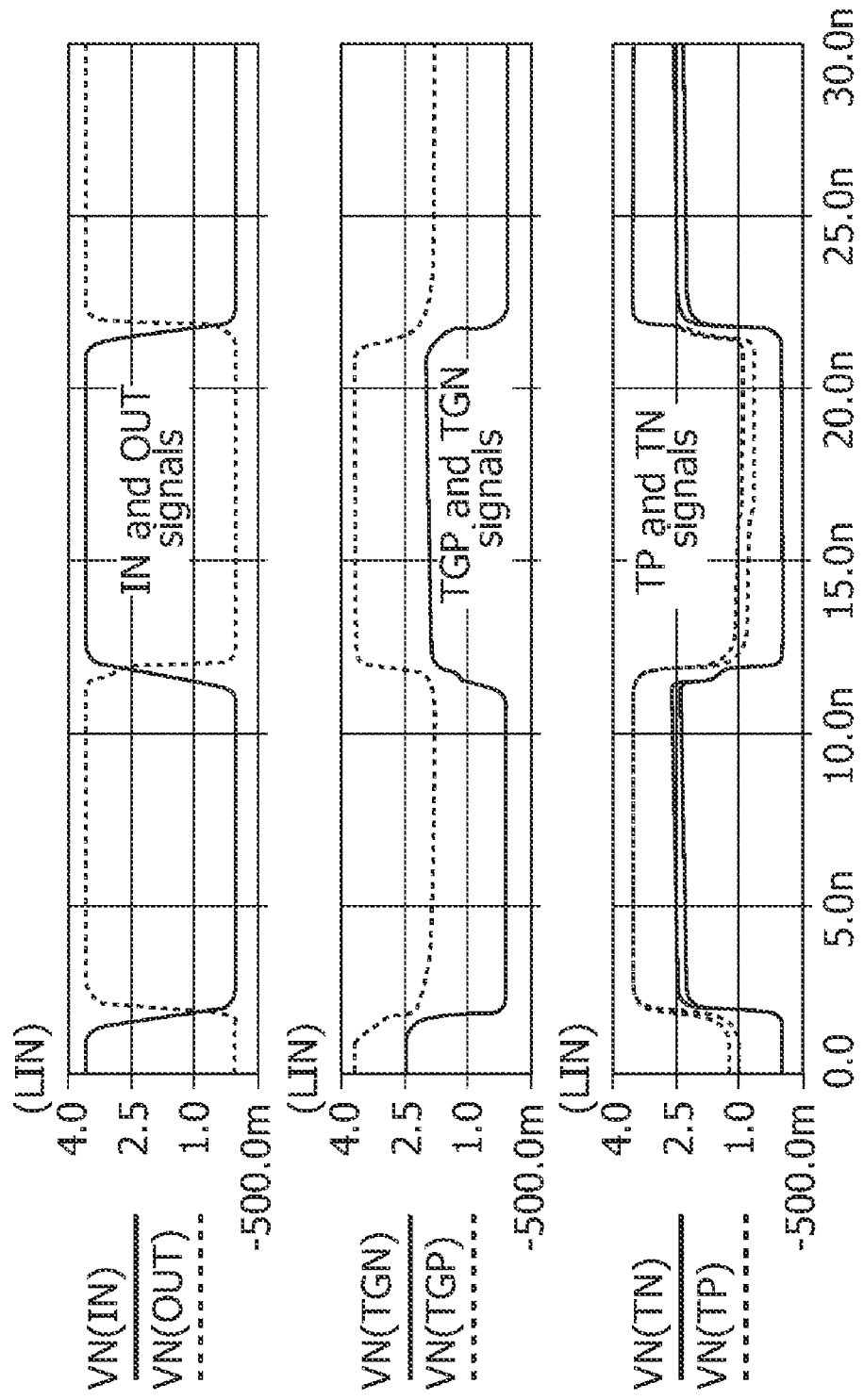

FIG. 9 shows a further graph of a transient result of the input, the output and intermediate signals for different process corners. In the topmost graph, the input and output signals of the inverter are shown. In the middle graph, the signals at the node tgn and tgp are shown. In the bottommost graph, the signals of the nodes tn and tp are shown.

Figure 10:
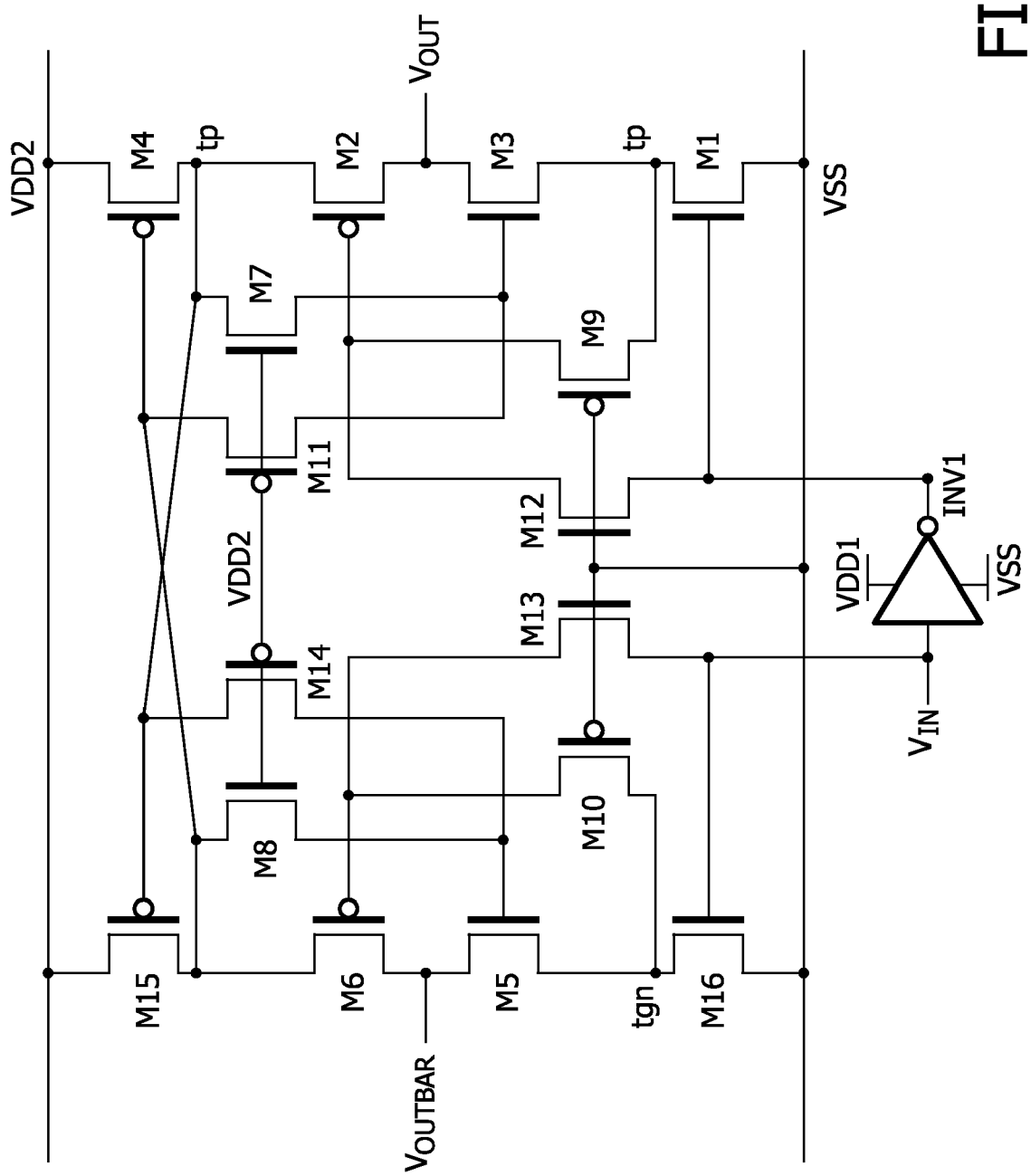

FIG. 10 shows a circuit diagram of a level shifter circuit according to the fourth embodiment. The level shifter comprises two outputs $V_{OUTBAR}$ and $V_{OUT}$. A first and third transistor M1, M3 are coupled between the output $V_{OUT}$ and Vss. A second and fourth transistor M2, M4 is coupled between $V_{OUT}$ and a second supply voltage VDD2. A fifth and sixteenth transistor M5, M16 are coupled between the output $V_{OUTBAR}$ and Vss. A sixth and fifteenth transistor M6, M15 is coupled between $V_{OUTBAR}$ and a second supply voltage VDD2. The fifth transistor M5 is coupled between the output $V_{OUTBAR}$ and a the node tgn. The sixteenth transistor M16 is coupled between the node tgn and the $V_{SS}$. An eighth transistor M8 is coupled between the gate of the fifth transistor M5 and a node between the fifthteenth and sixth transistor M15, M6. A tenth transistor M10 is coupled between the gate of the sixth transistor M6 and a node between the fifth and sixteenth transistor M16. A fourteenth transistor M14 is coupled between the gates of the fifth and fifthteenth transistor M5, M15. An eleventh transistor M11 is coupled between the gates of the fourth and third transistor M4, M3. The gates of the fourteenth and the eleventh transistor M14 and M11 are coupled together and are coupled to VDD2. A thirteenth transistor M13 is coupled between the gates of the sixth and sixteenth transistor M6, M16. A twelfth transistor M12 is coupled between the gates of the first and second transistor M1, M2. The gates of the thirteenth and the twelfth transistor M13 and M12 are coupled together and are coupled to VSS.

A seventh transistor M7 is coupled between the gate of the third transistor M3 and a node tp between the fourth and second transistor M4, M2. A ninth transistor M9 is coupled between the gate of the second transistor M2 and a node tp between the third and first transistor M1. The gate of the fourth transistor M4 is coupled to the node between the fifthteenth and sixth transistor M15, M6. The gate of the fifthteenth transistor M15 is coupled to node tp. The gates of the transistors M8 and M7 are coupled to the gates of the transistors M14 and M11. The gates of the transistors M10 and M9 are coupled to the gates of the transistors M12 and M13. The gate of the transistor M16 is coupled to the input $V_{IN}$, which is coupled to an input of an inverter INV1. The inverter INV1 is coupled to the supply voltage VDD1 and VSS. Therefore, a level shifter is provided based on the principles of the present invention such that CMOS devices can be used with an increased signaling voltage.

Accordingly, the circuits according to the first, second, third or fourth embodiment enable a usage of a low voltage process transistor or device with a higher supply voltage while still avoiding a static current consumption. The above described circuits can be implemented in mobile phones or in any other devices, which require low power circuits.

Summarizing, by using the circuits described according to the first, second, third or fourth embodiment, a 65 nm process technology providing 2.5 V process transistors which only tolerate a maximum of 2.75 voltage across their terminals can be combined with a 3.3 V signaling of their inputs and outputs, wherein the input/output voltage can rise up to 3.6 V. The principles described above are also applicable to future processes where the transistor supply voltages are scaled down. As the interfacing requirements with high voltage devices will continue to be present, the above described circuits are advantageous for upcoming processes.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be construed as limiting the scope of the claims.

The invention claimed is:

1. Electronic circuit, comprising
an input for coupling a circuit of a first voltage domain to the electronic circuit,
a first, second, third and fourth transistor coupled between a supply voltage and a voltage,
wherein the third transistor is coupled between the voltage and a first node, wherein the second transistor is coupled between a second node and the output, wherein the third transistor is coupled between the first node and the output, wherein the fourth transistor is coupled between the supply voltage and the second node, a first reference voltage generating unit which receives the voltage at the first node and the voltage as input, wherein its output is coupled to the gate of the second transistor, and a second reference voltage generating unit which receives the supply voltage and the voltage of the second node as input, wherein its output is coupled to the gate of the third transistor, wherein the first and second reference voltage generating units generate a reference voltage according to at least one of the logic states of the first, second, third or fourth transistor.

2. Electronic circuit according to claim 1, wherein the first reference voltage generating unit is implemented as a ninth transistor coupled between the first node and the gate of the second transistor and the second reference voltage generating unit is implemented as a seventh transistor coupled between the second node and the gate of the third transistor, wherein the gate of the seventh transistor is coupled to the supply voltage, wherein the gate of the ninth transistor is coupled to the voltage.

3. Electronic circuit according to claim 1, wherein the first and third transistor are of a first conductivity type, while the second and fourth transistor are of a second conductivity type.

4. Electronic circuit according to claim 1, further comprising a fifth transistor coupled between input and the gate of the first transistor, a sixth transistor coupled between the input and the gate of the fourth transistor, a third reference voltage generating unit receiving the supply voltage and the voltage at a third node as input, wherein its output is coupled to the gate of the fifth transistor, and a fourth reference voltage generating unit receiving the voltage and the voltage at a fourth node as input signals, wherein its output is coupled to the gate of the sixth transistor, wherein the third and fourth reference voltage generating units generate a reference voltage according to the logic states at the gate of the fourth transistor and the gate of first transistor, respectively.

5. Electronic circuit according to claim 4, wherein the third reference voltage generating unit is implemented as an eighth transistor coupled between the gate of the fourth and fifth transistor and the fourth reference voltage generating unit is implemented as a tenth transistor coupled between a fourth node and the gate of the sixth transistor, wherein the gate of the eighth transistor is coupled to the supply voltage, wherein the gate of the tenth transistor is coupled to the voltage.

6. Electronic circuit according to claim 5, furthermore comprising an eleventh transistor coupled between the fourth node and the gate of the third transistor, a twelfth transistor coupled between the gates of the first and second transistor, a thirteenth transistor coupled between the first node and the gate of the sixth transistor, and a fourteenth transistor coupled between the second node and the gate of the fifth transistor, wherein the gates of the eleventh and the fourteenth transistor are coupled to the supply voltage, wherein the gates of the twelfth and thirteenth transistor are coupled together and are coupled to the voltage.

7. Level shifter circuit comprising an input (VIN) and two outputs and an electronic circuit according to claim 1.

* * * * *